United States Patent
Chen et al.

(10) Patent No.: US 7,583,529 B2
(45) Date of Patent: Sep. 1, 2009

(54) MAGNETIC TUNNEL JUNCTION DEVICES AND MAGNETIC RANDOM ACCESS MEMORY

(75) Inventors: Wei-Chuan Chen, Taipei County (TW); Yung-Hung Wang, Taoyuan County (TW); Shan-Yi Yang, Hsinchu (TW); Kuei-Hung Shen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 137 days.

(21) Appl. No.: 11/676,239

(22) Filed: Feb. 16, 2007

(65) Prior Publication Data

US 2008/0094888 A1   Apr. 24, 2008

(30) Foreign Application Priority Data

Oct. 20, 2006   (TW)   .............................. 95138745 A

(51) Int. Cl.
   *G11C 11/15*   (2006.01)
(52) U.S. Cl. ................... 365/173; 365/171; 977/935
(58) Field of Classification Search ........... 365/158, 365/66, 80, 83, 85, 100, 148, 171, 173; 257/421, 257/E21.665; 977/933, 934, 935
   See application file for complete search history.

(56) References Cited

U.S. PATENT DOCUMENTS

| | | | |
|---|---|---|---|
| 5,953,248 A * | 9/1999 | Chen et al. ............... 365/158 |
| 6,114,719 A | 9/2000 | Dill et al. | |
| 6,259,586 B1 | 7/2001 | Gill | |
| 6,529,353 B2 | 3/2003 | Shimazawa | |
| 6,649,960 B1 | 11/2003 | Cross | |
| 6,724,586 B2 | 4/2004 | Gill | |
| 6,788,502 B1 | 9/2004 | Gill | |
| 6,847,510 B2 | 1/2005 | Childress et al. | |
| 6,956,764 B2 * | 10/2005 | Engel et al. ............... 365/158 |
| 7,068,536 B2 | 6/2006 | Matsutera et al. | |
| 2004/0120184 A1 * | 6/2004 | Janesky et al. ............ 365/158 |
| 2005/0099740 A1 | 5/2005 | Freitag et al. | |
| 2005/0230771 A1 * | 10/2005 | Ha et al. ................... 257/421 |
| 2006/0017081 A1 * | 1/2006 | Sun et al. .................. 257/295 |

FOREIGN PATENT DOCUMENTS

TW   I250651   3/2006

OTHER PUBLICATIONS

D.Y. Petrovykh et al. "Spin-dependent band structure, Fermi surface, and carrier lifetime of permalloy", Applied Physics Letters, Dec. 7, 1998, p. 3459-3461, vol. 73, No. 23, American Institute of Physics, US.

* cited by examiner

*Primary Examiner*—Richard Elms
*Assistant Examiner*—Harry W Byrne
(74) *Attorney, Agent, or Firm*—Quintero Law Office

(57) ABSTRACT

A magnetic random access memory (MRAM) is disclosed. The MRAM includes a first electrode, an antiferromagnetic layer formed over the first electrode, a pinned layer formed over the antiferromagnetic layer, a barrier layer formed over the pinned layer, a composite free layer formed over the barrier layer, and a second electrode formed over the composite free layer. The composite free layer includes a first magnetic layer, a spacer layer and a second magnetic layer sequentially stacked over the barrier layer and the spacer layer allows parallel coupling between the first and second magnetic layers. A magnetic tunnel junction (MTJ) device suitable for a memory unit of a magnetic memory device is also provided.

19 Claims, 5 Drawing Sheets

MAGNETIC TUNNEL JUNCTION DEVICES AND MAGNETIC RANDOM ACCESS MEMORY

BACKGROUND OF THE INVENTION

1. Field of the Invention

The invention relates to a magnetic random access memory (MRAM), and in particular a magnetic tunnel junction (MTJ) device for a MRAM.

2. Description of the Related Art

A magnetic random access memory (MRAM) typically comprises a combined magnetic multi-layer structure and a transistor, and provides better radiation resistance than conventional semiconductor materials. A magnetic random access memory (MRAM) is a non-volatile random access memory capable of retaining data after power-off, and is thus suitable for application in information, communication and computer products.

Data in a magnetic random access memory (MRAM) is recorded by changing magnetoresistance characteristics thereof, providing advantages such as low power consumption, non-volatile memory behaviors and unlimited writing and reading. Memory units in the MRAM are typically formed in a stacked structure including an antiferromagnetic (AFM) layer of antiferromagnetic materials, a pinned layer of magnetic materials, a barrier layer, and a free layer of magnetic materials. While data is written, a memory unit can be selected by providing induced magnetic fields at two separate conductive lines, for example a bit line and a data line, to thereby change direction of the magnetization of a free layer and the magnetoresistance of a selected memory unit. Thus, while data is read, a bit status of the stored data can be obtained by distinguishing the magnetoresistance (MR) thereof. In general, whether a memory status of a memory unit is under "1" or "0" can be determined by distinguishing whether the magnetization of the free layer and the pinned layer adjacent to the barrier layer are in parallel or antiparallel. The memory status stored can be kept forever and is not changed until a magnetic field is applied thereto.

Nevertheless, when designing high density MRAM, memory unit size in thereof must be reduced to increase the number of units formed in a predetermined area. With the trend of memory unit size reduction, a switching field applied to the memory units is thus increased, thereby increasing a current applied on the conductive lines. In addition, switching uniformity of a free layer of all the memory units in a MRAM must be considered to increase a writing window thereof. Thus, a memory unit structure must be improved to reduce switching fields, current applied to the conductive lines, and narrow variation of switching field.

Thus, memory units having great MR ratio, faster reading speed, and uniform switching behavior, and wider writing window are needed in high density MRAM applications to thereby simultaneously reduce switching fields and currents applied to the conductive lines and to unite the switching behaviors of the memory units therein.

BRIEF SUMMARY OF THE INVENTION

A magnetic random access memory (MRAM) and a magnetic tunnel junction (MTJ) device are provided.

An exemplary embodiment of an MRAM comprises: a first electrode; an antiferromagnetic layer formed over the first electrode; a pinned layer formed over the antiferromagnetic layer; a barrier layer formed over the pinned layer; a composite free layer formed over the barrier layer, and a second electrode formed over the composite free layer. The composite free layer comprises a first magnetic layer, a spacer layer and a second magnetic layer sequentially stacked over the barrier layer and the spacer layer allows parallel coupling between the first and second magnetic layers.

An exemplary embodiment of a magnetic tunnel junction (MTJ) device comprises: a composite free layer formed over a barrier layer; the composite free layer comprises a first magnetic layer, a spacer layer and a second magnetic layer sequentially stacked over the barrier layer. The first and second magnetic layer comprises different magnetic materials and the spacer layer allows parallel coupling between the first and second magnetic layers.

Another embodiment of a magnetic tunnel junction (MTJ) device comprises: an antiferromagnetic layer; a pinned layer formed over the antiferromagnetic layer; a barrier layer formed over the pinned layer, and a composite free layer formed over the barrier layer. The composite free layer comprises a first magnetic layer, a spacer layer and a second magnetic layer sequentially stacked over the barrier layer. The first magnetic layer has a first spin polarization. The second magnetic layer has a second spin polarization. The first spin polarization is greater than the second spin polarization.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-5 are schematic diagrams illustrating various exemplary embodiments of a magnetic random access memory (MRAM).

Figure 1:
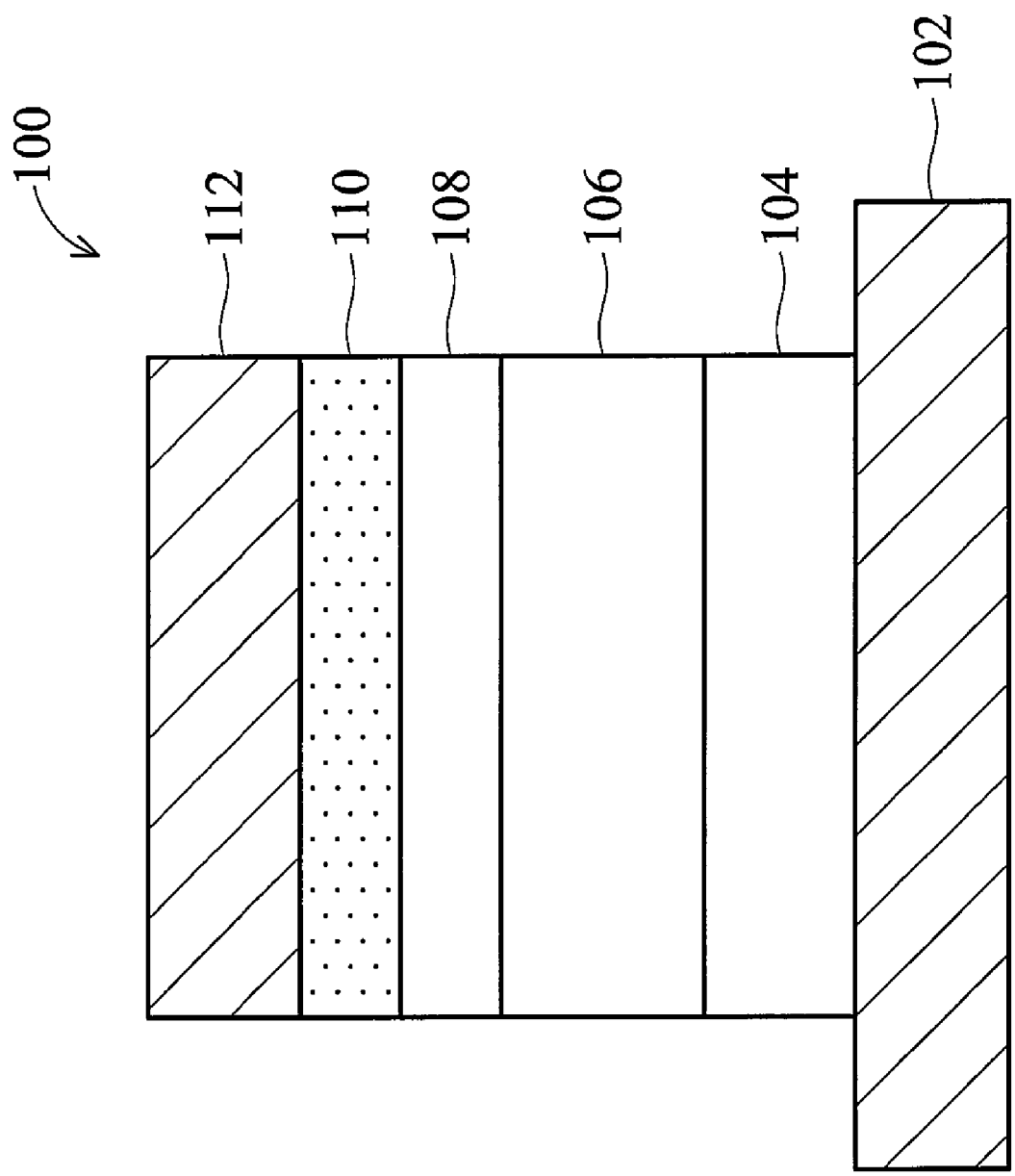
FIG. 1 is a cross section showing a memory unit of a magnetic random access memory (MRAM) known by the inventors.

Referring now to FIG. 1, a cross section of a memory unit 100 of an MRAM known to the inventors is illustrated. The memory unit 100 illustrated here is as a comparison with an exemplary embodiment of the invention but is not to limit the scope of the invention.

As shown in FIG. 1, the memory unit 100 includes an antiferromagnetic layer 104, a pinned layer 106, a barrier layer 108 and a free layer 110 are sequentially stacked over an electrode 102 and another electrode 112. The antiferromagnetic layer 104 may comprise antiferromagnetic materials such as PtMn and IrMn. The pinned layer 106 is typically formed as a synthetic antiferromagnetic (SAF) layer (not shown) comprising a non-magnetic sub-layer and two magnetic sub-layers separated by the non-magnetic layer formed in a stacked structure. Herein, the non-magnetic sub-layer may comprise Ru and the magnetic sub-layers may comprise Co, Fe, CoFe, NiFe, and CoFeB or combinations thereof. The barrier layer 108 formed over the pinned layer 106 may comprise insulating materials such as AlOx, TiN, TaN or MgO. The free layer 110 formed over the barrier layer 108 may comprise ferromagnetic materials such as Co, Fe, CoFe, CoFeB, CoFeNi or NiFe.

Figure 2:
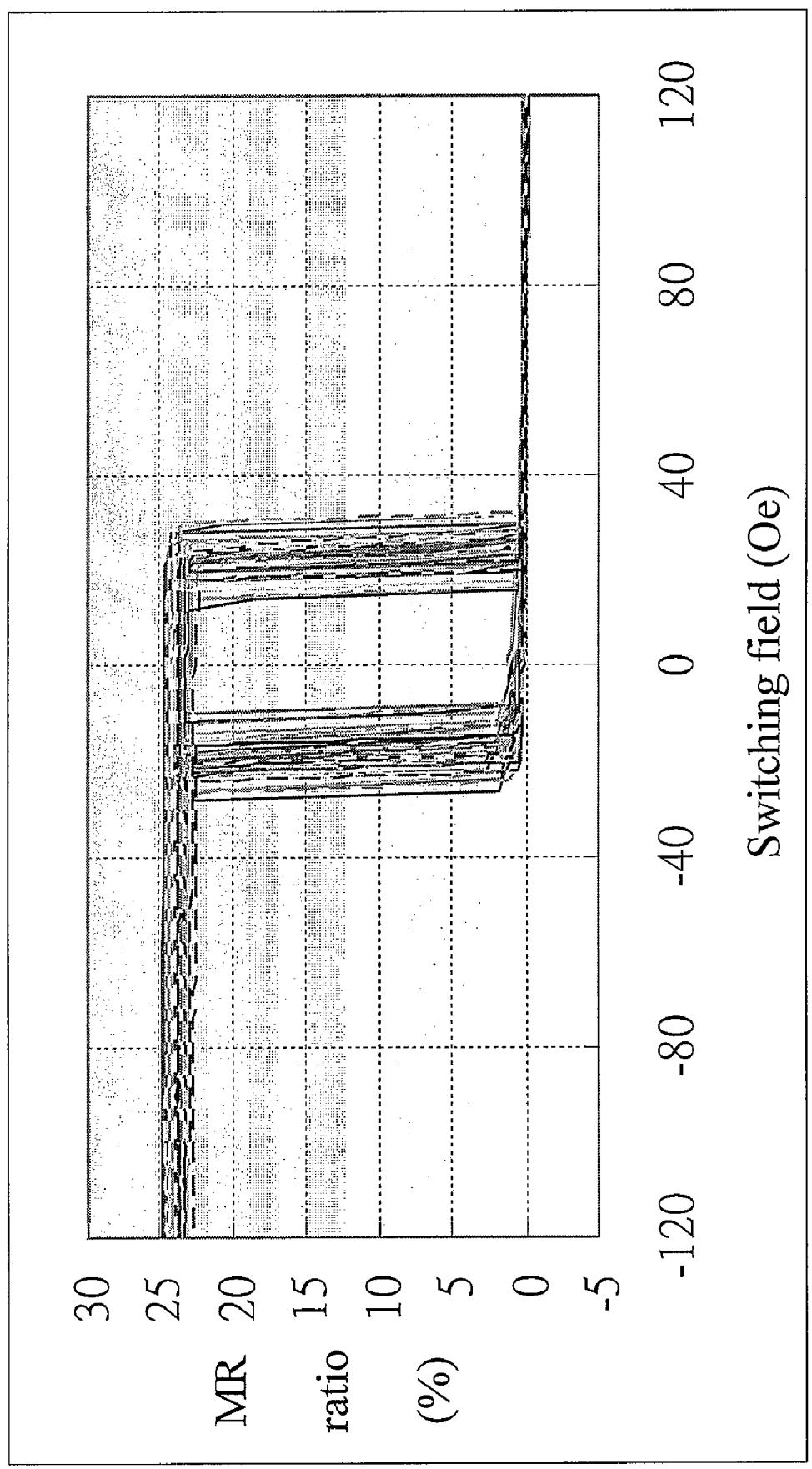
FIG. 2 shows a Magnetoresistance (MR) loop of a hundred memory units as illustrated in FIG. 1 formed over a 8" silicon wafer.

While the free layer 110 in the memory unit 100 comprises CoFeB, the memory unit may perform a magnetoresistance (MR) ratio greater than 50%. A switching field great than 50 Oe is, however, needed for writing the memory unit 100, thereby increasing the current required for writing. Because the high magnetostrictive coefficient and material characteristics of the described material, the switching performance of the free layer cannot be easily controlled. Thus a high MR ratio can be obtained but poor switching uniformity results, thereby reducing or even eliminating a writing window thereof. Additionally, while the free layer comprises NiFe, the memory unit may have a magnetoresistance (MR) ratio of about 25%. The switching uniformity is improved but the MR ratio is somehow reduced, thereby reducing the reading speed thereof and is not desirable for the reading operation in all MRAM for a high speed and high density application. FIG. 2 shows a magnetoresistance (MR) loop of a MRAM memory having a hundred magnetic tunnel junction (MTJ) devices formed over an 8" silicon wafer, the free layer in the MJT devices now comprises NiFe.

Figure 3:
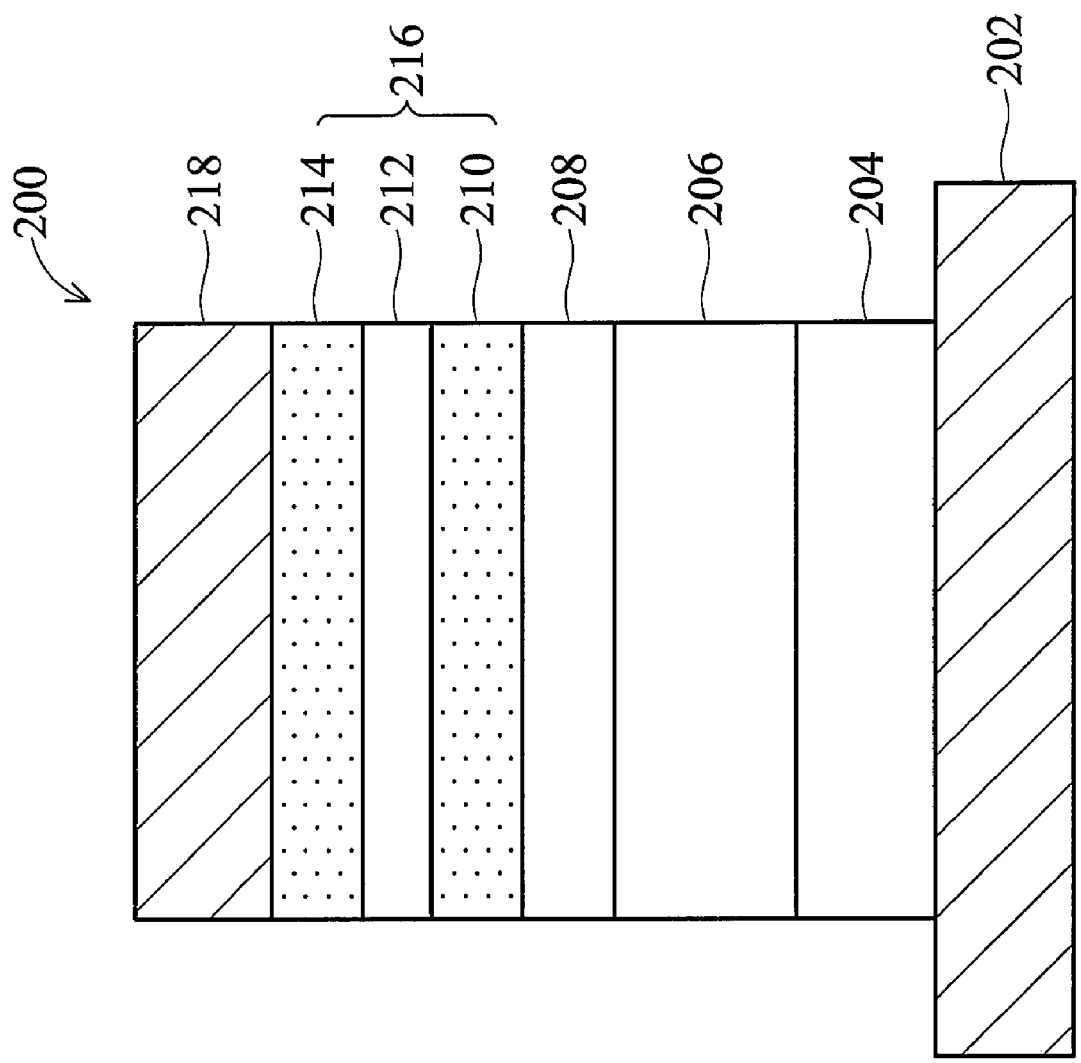
FIG. 3 is cross section showing a memory unit of a magnetic random access memory (MRAM) according to an embodiment of the invention.

Thus, to reduce the switching field, currents applied to the conductive lines, and switching uniformity of the memory units in a MRAM and simultaneously maintain a high MR ratio, the inventors now provide a memory unit structure and the MJT device therein, both capable of a MRAM for high speed and high density applications. Referring now to FIG. 3, a memory unit 200 of a MRAM according to an exemplary embodiment is illustrated.

As shown in FIG. 3, the memory unit 200 includes an antiferromagnetic layer 204, a pinned layer 206, a barrier layer 208 and a composite free layer 216 and another electrode layer 218 sequentially stacked over an electrode 202. The stacked structure formed between the electrodes 202 and 218 functions as a MTJ device of the memory unit 200.

Still referring to FIG. 3, the antiferromagnetic layer 204 may comprise antiferromagnetic materials such as PtMn and IrMn. The pinned layer 206 is typically formed as a synthetic antiferromagnetic (SAF) layer comprising a non-magnetic sub-layer and two magnetic sub-layers separated by the non-magnetic layer formed in a stacked structure (not shown). Herein, the non-magnetic sub-layer may comprise Ru and the magnetic sub-layers may comprise Co, Fe, CoFe, NiFe, and CoFeB or combinations thereof. The barrier layer 208 formed over the pinned layer 206 may comprise insulating materials such as AlOx, TiN, TaN or MgO. The composite free layer 216 may include a magnetic layer 210, a spacer layer 212 and a magnetic layer 214 sequentially formed over the barrier layer 208, wherein the magnetic layers 210 and 214 may comprise different magnetic materials or may comprise the same magnetic material but of different thicknesses. In addition, within the composite free layer 216, the overlying magnetic layer 214 and the underlying magnetic layer 210 have different magnetic characteristics. The magnetic layer 214 may comprise a material of less magnetostrictive, such as NiFe, having a thickness of about 15~35 Å. The magnetic layer 210 may comprise a material of higher, spin-polarization such as Co, CoFe, CoFeNi, having a thickness of about 8~20 Å. In addition, the spacer layer 212 may comprise a material for strongly allowing interlayer coupling between the above two magnetic layers, such as Ru, Cr, Ta or Cu, having a thickness less than 7A. According to RKKY effect, or magnetostatic coupling, this thin spacer layer 212 formed between the magnetic layer 210 and 214 allows ferromagnetic coupling forces formed therebetween, thereby allowing parallel coupling between the magnetic layers 210 and 214 within the composite free layer 216, thereby improving the switching uniformity of the memory unit 200. The use of only one magnetic layer 210 offers a MR ratio of about 50~55% but a poor switching uiiiformity, thus, a poor writing window results. With the use of only the magnetic layer 214, however, a MR ratio of about 25~30% and good switching uniformity are obtained. The use of composite free layer 216, however, offers a MR ratio of about 40~45% and also good switching uniformity.

Figure 4:
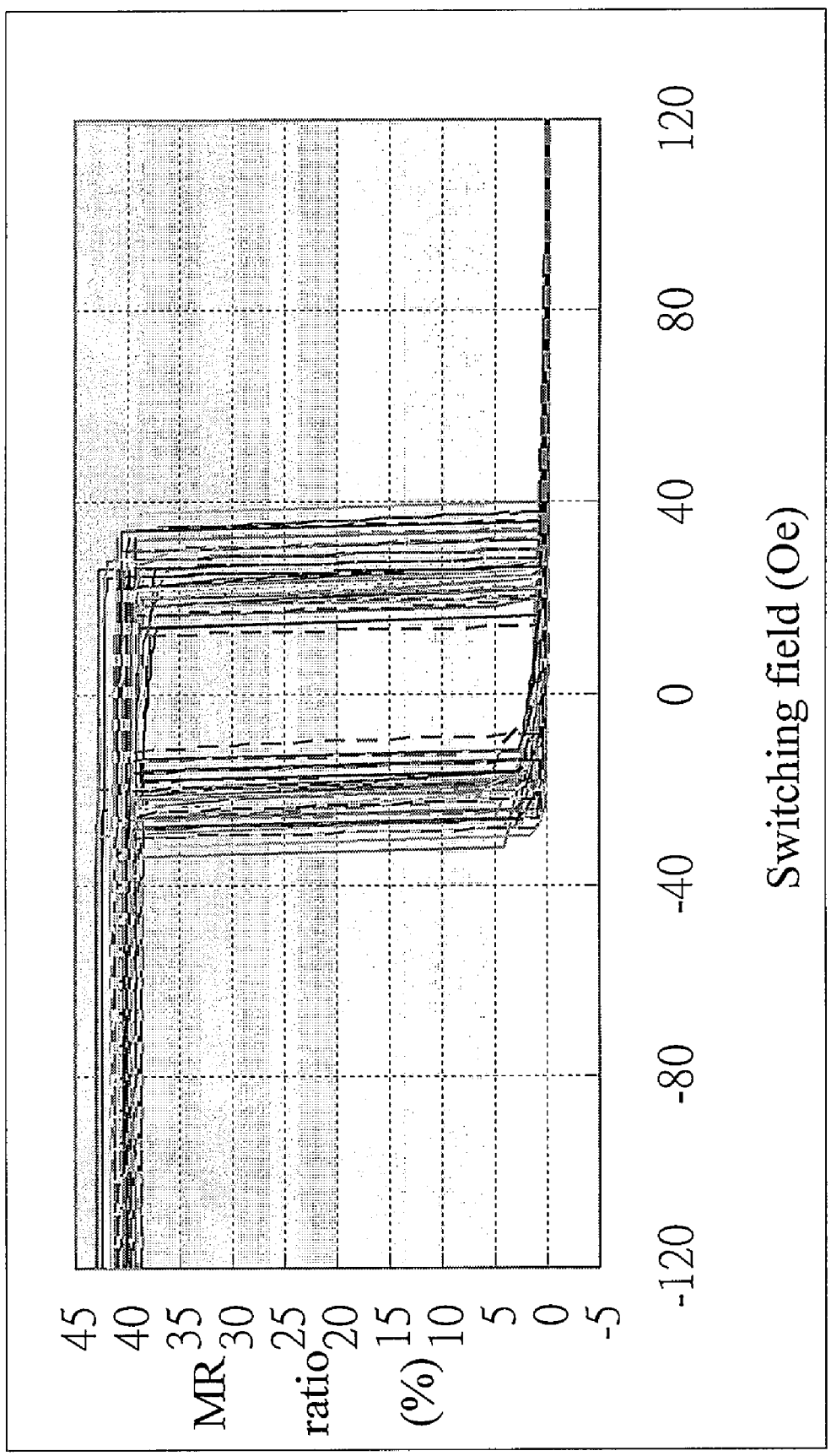
FIG. 4 shows a Magnetoresistance (MR) loop of a hundred memory units as illustrated in FIG. 4 formed over a 8" silicon wafer.

Referring now to FIG. 4, a magnetoresistance (MR) loop of a MRAM having a hundred magnetic tunnel junction devices formed over an 8" silicon wafer is illustrated, the MJT devices of the MRAM are the same as that illustrated in the memory unit 200 of FIG. 3. As shown in FIG. 4, the memory unit 200 comprising composite free layer 216 offers a MR ratio of about 40~45% under a switching field of about 25~35 Oe. Thus, when an MRAM adopts memory unit 200, the switching performance of the memory units therein can be united and the currents can be further reduced due to smaller switching field, thereby ensuring high reading speed result from high MR ratio. Thus, the memory unit illustrated in FIG. 3 and the MTJ device thereof are both suitable for the application of high speed, high density MRAM and fabrication thereof, thereby forming a high density MRAM device having high MR ratio and uniform free layer switching performance.

The memory unit 200 illustrated in FIG. 3 can be fabricated by conventional semiconductor fabricating processes, such as thin film deposition, photolithography and etching and for simplicity are not described again here.

Figure 5:
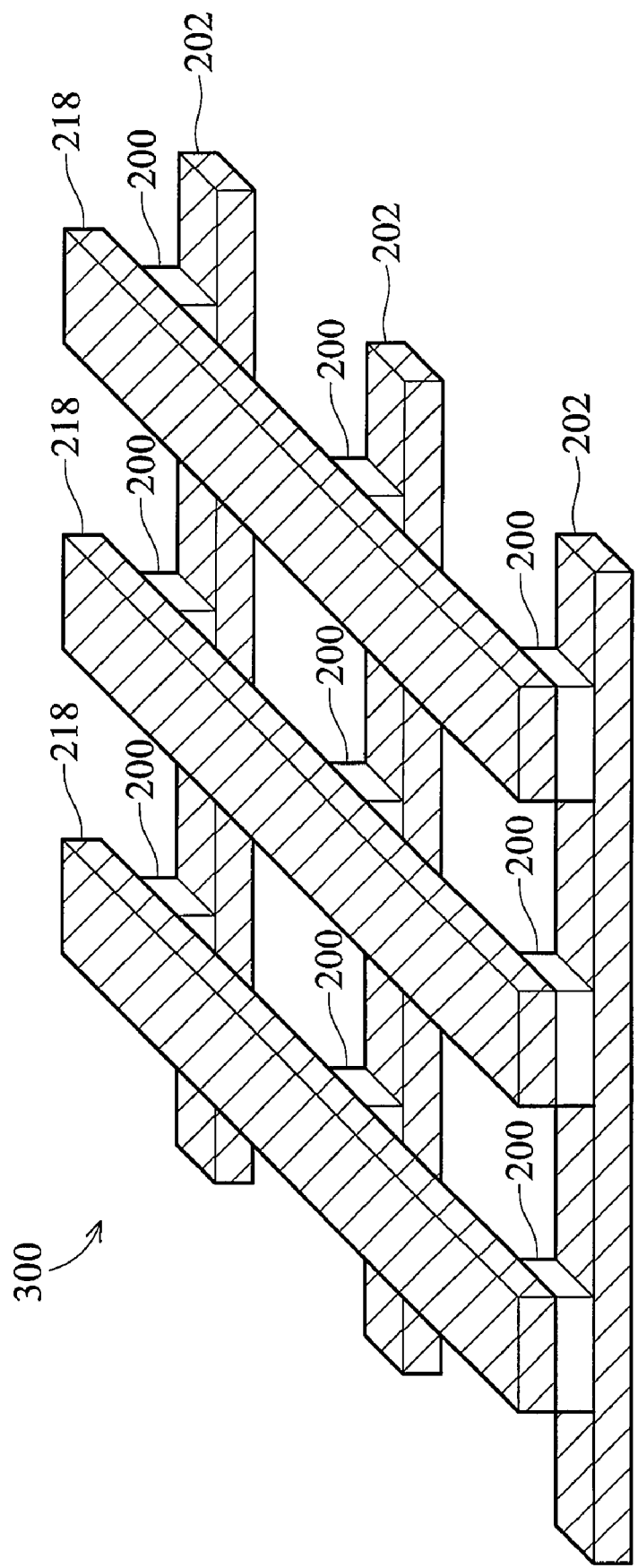
FIG. 5 is a stereographic diagram showing arrangements in a magnetic random access memory (MRAM) according to an embodiment of the invention.

In FIG. 5, a stereographic diagram of a MRAM 300 is illustrated. Herein, the MRAM 300 comprises a plurality inter-crossing electrodes 218 and 202, functioning as conductive lines. A memory unit 200 as that illustrated in FIG. 3 is now sandwiched between the electrodes 218 and 202. The structure of the memory unit 200 is the same as the memory device 200 illustrated in FIG. 3.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A magnetic random access memory (MRAM), comprising:

a first electrode;
an antiferromagnetic layer formed over the first electrode;
a pinned layer formed over the antiferromagnetic layer;
a barrier layer formed over the pinned layer;
a composite free layer formed over the barrier layer, wherein the composite free layer comprises a first magnetic layer, a spacer layer and a second magnetic layer sequentially stacked over the barrier layer; and a second electrode formed over the composite free layer,
wherein the first and second magnetic layers comprise different magnetic materials and the spacer layer allows parallel coupling between the first and second magnetic layers.

2. The MRAM as claimed in claim 1, wherein the spacer layer has a thickness less than 7Å.

3. The MRAM as claimed in claim 1, wherein the first magnetic layer has a first spin polarization, the second magnetic layer has a second spin polarization, and the first spin polarization is greater than the second spin polarization.

4. The MRAM as claimed in claim 1, wherein the first magnetic layer provides a first magnetoresistance (MR) ratio while the first magnetic layer functions as single free layer disposed on the barrier layer, the second magnetic layer provides a second magnetoresistance (MR) ratio while the second magnetic layer functions as single free layer disposed on the barrier layer, the first magnetoresistance (MR) ratio is greater than the second magnetoresistance (MR) ratio.

5. The MRAM as claimed in claim 1, wherein the first magnetic layer comprises Co, CoFeB or CoFe.

6. The MRAM as claimed in claim 1, wherein the second magnetic layer comprises NiFe, CoFeB or CoFeNi.

7. The MRAM as claimed in claim 1, wherein the barrier layer comprises AlOx, TiN, TaN or MgO.

8. The MRAM as claimed in claim 1, wherein the spacer layer comprises Ru, Cr, Ta or Cu.

9. A magnetic tunnel junction (MTJ) device, suitable for a memory unit of a magnetic memory device, comprising:
a composite free layer formed over a barrier layer, wherein the composite free layer comprises a first magnetic layer of a first magnetic material, a spacer layer and a second magnetic layer of a second magnetic material sequentially stacked over the barrier layer,
wherein the first and second magnetic layers comprise different magnetic materials and the spacer layer allows parallel coupling between the first and second magnetic layers.

10. The MTJ device as claim in claim 9, wherein the first magnetic material comprises Co, CoFeB or CoFe.

11. The MTJ device as claim in claim 9, wherein the second magnetic material comprises NiF, CoFeB or CoFeNi.

12. The MTJ device as claim in claim 9, wherein the spacer layer comprises Ru, Cr, Ta or Cu.

13. The MTJ device as claim in claim 9, wherein the spacer layer has a thickness less than 7 Å.

14. A magnetic tunnel junction (MTJ) device, suitable for a memory unit of a magnetic memory device, comprising:
an antiferromagnetic layer;
a pinned layer formed over the antiferromagnetic layer;
a barrier layer formed over the pinned layer; and
a composite free layer formed over the barrier layer, wherein the composite free layer comprises a first magnetic layer, a spacer layer and a second magnetic layer sequentially stacked over the barrier layer,
wherein the first magnetic layer has a first spin polarization, the second magnetic layer has a second spin polarization, and the first spin polarization is greater than the second spin polarization.

15. The MTJ device as claim in claim 14, wherein the first magnetic layer comprises Co, CoFeB or CoFe.

16. The MTJ device as claim in claim 14, wherein the second magnetic layer comprises NiFe, CoFeB or CoFeNi.

17. The MTJ device as claim in claim 14, wherein the barrier layer comprises AlOx, TiN, TaN or MgO.

18. The MTJ device as claim in claim 14, wherein the spacer layer comprises Ru, Cr, Ta or Cu.

19. The MTJ device as claim in claim 14, wherein the first magnetic layer provides a first magnetoresistance (MR) ratio while the first magnetic layer functions as single free layer disposed on the barrier layer, the second magnetic layer provides a second magnetoresistance (MR) ratio while the second magnetic layer functions as single free layer disposed on the barrier layer, the first magnetoresistance (MR) ratio is greater than the second magnetoresistance (MR) ratio.

* * * * *